US009601678B2

(12) United States Patent
Cho

(10) Patent No.: US 9,601,678 B2
(45) Date of Patent: Mar. 21, 2017

(54) THERMOELECTRIC DEVICE AND METHOD OF MANUFACTURING THE SAME

(75) Inventor: Jin-woo Cho, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1235 days.

(21) Appl. No.: 13/098,831

(22) Filed: May 2, 2011

(65) Prior Publication Data

US 2012/0111387 A1 May 10, 2012

(30) Foreign Application Priority Data

Nov. 9, 2010 (KR) ........................ 10-2010-0111138

(51) Int. Cl.
*H01L 35/32* (2006.01)
*H01L 35/34* (2006.01)

(52) U.S. Cl.
CPC .............. *H01L 35/32* (2013.01); *H01L 35/34* (2013.01)

(58) Field of Classification Search
USPC .......................................................... 136/225
See application file for complete search history.

(56) References Cited

U.S. PATENT DOCUMENTS 4,626,964 A 12/1986 Azuma et al.
6,621,687 B2 9/2003 Lewis, Jr. et al.
6,768,230 B2 7/2004 Cheung et al.
6,826,916 B2 12/2004 Shimada et al.
6,914,343 B2 7/2005 Hiller et al.
7,057,330 B2 6/2006 Buhler et al.
7,157,835 B2 1/2007 Sakai
7,245,062 B2 7/2007 Schmidt
2005/0000558 A1 1/2005 Moriyama et al.
2005/0016183 A1* 1/2005 Tateyama et al. ............... 62/3.7
2006/0048807 A1 3/2006 Lee et al.
2011/0094556 A1* 4/2011 Stark ............................ 136/205

FOREIGN PATENT DOCUMENTS

JP 05-226704 A 9/1993
JP 06-169109 A 6/1994
JP 2002-280621 A 9/2002
JP 2002335021 A * 11/2002
JP 2004-221504 A 8/2004
KR 10-0668610 B1 1/2007

OTHER PUBLICATIONS

Machine translation (JP 2002-335021 A, Suzuki, Mitsuko).*

* cited by examiner

*Primary Examiner* — Jennifer Michener
*Assistant Examiner* — Dustin Q Dam
(74) *Attorney, Agent, or Firm* — Sughrue Mion, PLLC

(57) ABSTRACT

A thermoelectric device and a method for manufacturing the same are provided. The thermoelectric device includes a middle substrate, electrodes, N-type thermopiles, and P-type thermopiles, in which the N-type thermopile and the P-type thermopile are electrically connected to each other by the electrodes in series. The thermoelectric device includes further includes an upper substrate bonded to an upper surface of the middle substrate and a lower substrate bonded to a lower surface of the substrate, such that a temperature difference is provided between opposite sides of each of the N-type thermopiles and the P-type thermopiles.

11 Claims, 9 Drawing Sheets

THERMOELECTRIC DEVICE AND METHOD OF MANUFACTURING THE SAME

CROSS-REFERENCE TO RELATED APPLICATION

This application claims priority under 35 U.S.C. §119(a) from Korean Patent Application No. 10-2010-0111138, filed on Nov. 9, 2010, the disclosure of which is incorporated by reference in its entirety for all purposes.

BACKGROUND

Field

The following description relates to a thermoelectric device and a method of manufacturing the same, and more particularly, to a thermoelectric device and a method of manufacturing the same, capable of securing improved mechanical strength and generation efficiency.

Description of the Related Art

The Seebeck effect is a phenomenon by which an electromotive force is generated by the presence of a temperature difference in the natural world, machinery, buildings, artifacts, etc. If an energy generation device based on the Seebeck effect is used to provide electrical energy in various types of electronic products, battery life is increased. Further, an electronic product having low power consumption does not require battery replacement or does not require a battery at all.

The electromotive force generated using the Seebeck effect has an output voltage on a scale of millivolts. Accordingly, in order to obtain a desired level of voltage from a thermoelectric device, a plurality of thermopiles in the thermoelectric device are electrically connected in series and thermally connected in parallel.

When a thermoelectric device is manufactured by thin film processing, the electrical and thermal connections of the thermopiles are achieved by a single process using one the same conductive material for both electrical and thermal connections. That is, a plurality of thermopiles are formed on a lower wafer by thin film processing, and the lower wafer with the thermopiles is bonded to an upper wafer such that the thermopiles are electrically connected in series and thermally connected in parallel. In the bonding of the wafers, a soldering material or a conductive polymer material is used. However, such an adhesion material for bonding has a relatively high electrical resistance, which increases the total resistance of the thermopiles that are electrically connected in series.

A typical thermopile, which is manufactured through a thin film processing, has a small cross section and a large length which increases the thermal resistance of the thermopile. However, since the thermopile provided in the form of a thin film also has a low mechanical strength, the mechanical strength of a bond is not secure when another wafer is bonded to a wafer on which the thermopiles are formed. In addition, a bonding pressure may cause process faults, such as breakage of the thermopiles, so that the yield of the thermopiles is lowered. Even in a case in which the bonding process is successfully achieved, a rigid material, which is inserted between the upper and lower wafers to reinforce the mechanical strength when using thermopiles, forms an additional heat transfer path between the upper and lower wafers. In contrast, in order to maximize generation efficiency, the heat received from the lower wafer needs to be transferred to the upper wafer through only the thermopiles themselves. If the heat is transferred to the upper wafer through the supplementary material inserted between the upper and lower wafers, the generation efficiency is lowered.

SUMMARY

The following description relates to a thermoelectric device and a method of manufacturing the same, capable of securing the mechanical strength and improved generation efficiency.

According to an aspect of an embodiment, there is provided a thermoelectric device including a middle substrate, an upper substrate, a lower substrate, electrodes, N-type thermopiles, and P-type thermopiles, in which the N-type thermopiles and the P-type thermopiles are electrically connected to each other by the electrodes in series while being alternately disposed on the electrodes. The upper and lower substrates are bonded to an upper surface and a lower surface of the middle substrate, respectively, such that a temperature difference is provided between opposite sides of each of the N-type thermopiles and the P-type thermopiles.

According to an aspect of another embodiment, there is provided a method of manufacturing a thermoelectric device. At least one cavity is formed in a middle substrate. A dispensing is performed to dispose a dispensing material within the at least one cavity. Electrodes are formed on the middle substrate. The N-type thermopiles and the P-type thermopiles are disposed on the electrodes so that the electrodes electrically connect the N-type thermopiles and the P-type thermopiles in series. The dispensing material is removed. The upper substrate is bonded to an upper surface of the middle substrate and the lower substrate is bonded to a lower surface of the middle substrate, such that a temperature difference is provided between opposite sides of each of the N-type thermopiles and the P-type thermopiles.

BRIEF DESCRIPTION OF THE DRAWINGS

The above and/or other aspects will become apparent and more readily appreciated from the following description of embodiments, taken in conjunction with the accompanying drawings, in which.

DETAILED DESCRIPTION

Figure 1:
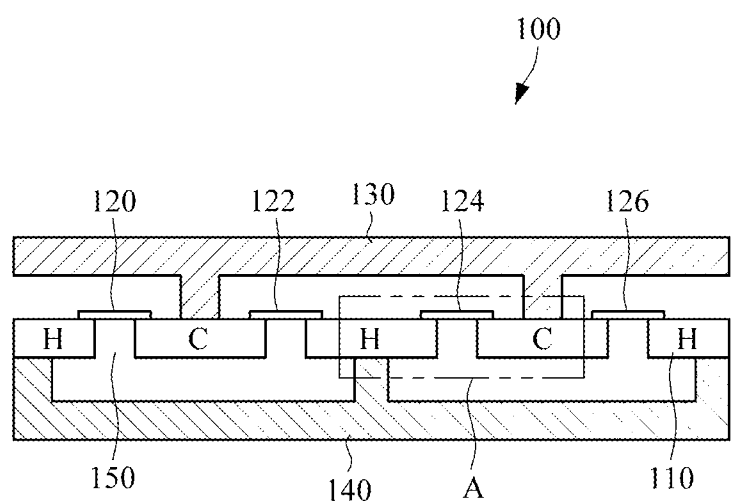
FIG. 1 illustrates a cross section of a thermoelectric device according to an embodiment.

The following detailed description is provided to assist the reader in gaining a comprehensive understanding of the methods, apparatuses and/or systems described herein. Various changes, modifications, and equivalents of the systems, apparatuses and/or methods described herein will suggest themselves to those of ordinary skill in the art. Descriptions of well-known functions and structures are omitted to enhance clarity and conciseness.

Hereinafter, examples will be described with reference to accompanying drawings in detail.

Elements, features, and structures are denoted by the same reference numerals throughout the drawings and the detailed description, and the size and proportions of some elements may be exaggerated in the drawings for clarity and convenience.

FIG. 1 illustrates a cross section of a thermoelectric device according to an example.

A thermoelectric device 100 is formed by bonding a middle substrate 110 to a pair of substrates 130 and 140. A plurality of thermopiles 120, 122, 124 and 126 are formed on the middle substrate such that at least one thermopile is disposed at each side of each of a plurality of cavities 150 that are formed in the middle substrate 110. The thermopiles 120, 122, 124 and 126 may be formed on the middle substrate 110 through a thin film processing. Although not shown in FIG. 1, N-type thermopiles and P-type thermopiles are alternately disposed on one surface of the middle substrate 110 and are spaced from each other.

Electrodes (not shown in FIG. 1) including a conductive material, such as a metal having a high electrical conductivity, are formed on the one surface of the middle substrate 110. The electrodes are connected to ends of the N-type thermopiles and the P-type thermopiles such that the N-type thermopiles and the P-type thermopiles are electrically connected in series.

The pair of substrates 130 and 140 are bonded to opposite sides of the middle substrate 110 to provide a temperature difference to the thermopiles 120, 122, 124 and 126. The pair of substrates 130 and 140 include a low temperature substrate 130 providing a low temperature to the middle substrate 110, and a high temperature substrate 140 providing a high temperature to the middle substrate 110. The low temperature substrate 130 and the high temperature substrate 140 are bonded to an upper part of the middle substrate 110 and a lower part of the middle substrate 110, respectively, such that a temperature difference is provided between opposite sides of each of the thermopiles 120, 122, 124 and 126.

That is, one side of each thermopile 120, 122, 124 and 126 has a low temperature due to the heat flow of the low temperature substrate 130, and the opposite side of each thermopile 120, 122, 124 and 126 has a high temperature due to the heat flow of the high temperature substrate 140. For example, the left side of the thermopile 120 has a high temperature state (H) due to the heat that is transferred from the high temperature substrate 140 and the right side of the thermopile 120 has a low temperature state (C) due to the heat that is transferred to the low temperature substrate 140, so a thermal difference or a thermal gradient is formed between opposite sides of the thermopile 120.

The middle substrate 110 includes at least one cavity 150 that is configured to allow a heat transferred from the high temperature substrate 140 to pass into the low temperature substrate 130 only through the thermopiles 120, 122, 124 and 126. The cavity 150 may have a bar shape and there may be a plurality of cavities 150 provided in the middle substrate 110.

The middle substrate 110 may include a material having a heat transfer coefficient smaller than a heat transfer coefficient of the pair of substrates 130 and 140 that are bonded to the upper part and the lower part of the middle substrate 110. For example, the middle substrate 110 may be composed of glass and the low temperature substrate 130 and the high temperature substrate 140 may be composed of silicon.

The low temperature substrate 130 and the high temperature substrate 140 may each include a plurality of bonding ends that are spaced from each other and that provide cavities therebetween. In this configuration, a temperature difference is provided to opposite sides of each thermopile 120, 122, 124 and 126 placed across the cavities 150. A process of bonding the low temperature substrate 130 and the high temperature substrate 140 will be described later with reference to FIGS. 3A, 3B and 3C.

In contrast to a configuration of a thermoelectric device in which the electrical and thermal connections are achieved through a single structure, according to a configuration of the thermal electric device 100, the electrical and thermal connections are implemented independently of each other. That is, the electrical connection is achieved by the electrodes disposed on the middle substrate 110, and the thermal connection is achieved by a structure that is obtained by bonding the low temperature substrate 130 to the high temperature substrate 130 while interposing the middle substrate 110 therebetween. Accordingly, when manufacturing the thermoelectric device 100, the materials used for the electrical connection and the thermal connection are separately selected to be optimized for each particular type of connection. For example, a material having a low electrical resistance may be selected to form the electrodes that are used to electrically connect the thermopiles each other in series and a material having a high heat transfer coefficient may be selected to bond the middle substrate 110 to the low temperature substrate 130 and to the high temperature substrate 140.

As compared to a bonding process in which wafers are bonded to a thin film thermopile having a low mechanical strength, according to this embodiment, the low temperature substrate 130 and the high temperature substrate 140 producing a heat flow on the thermopiles 120, 122, 124 and 126 are bonded to the middle substrate 110, thereby increasing the yield of the thermoelectric device, securing improved mechanical strength when the bonding is finished, and thereby increasing the reliability of the thermoelectric device. In addition, there is no need to insert an additional material to reinforce the mechanical strength of the thermoelectric device, and this prevents an additional heat transfer path from being formed by the additional material. Accordingly, the temperature difference applied to opposite two sides of the thermopiles is maximized, thereby enhancing the generation efficiency.

Figure 2:
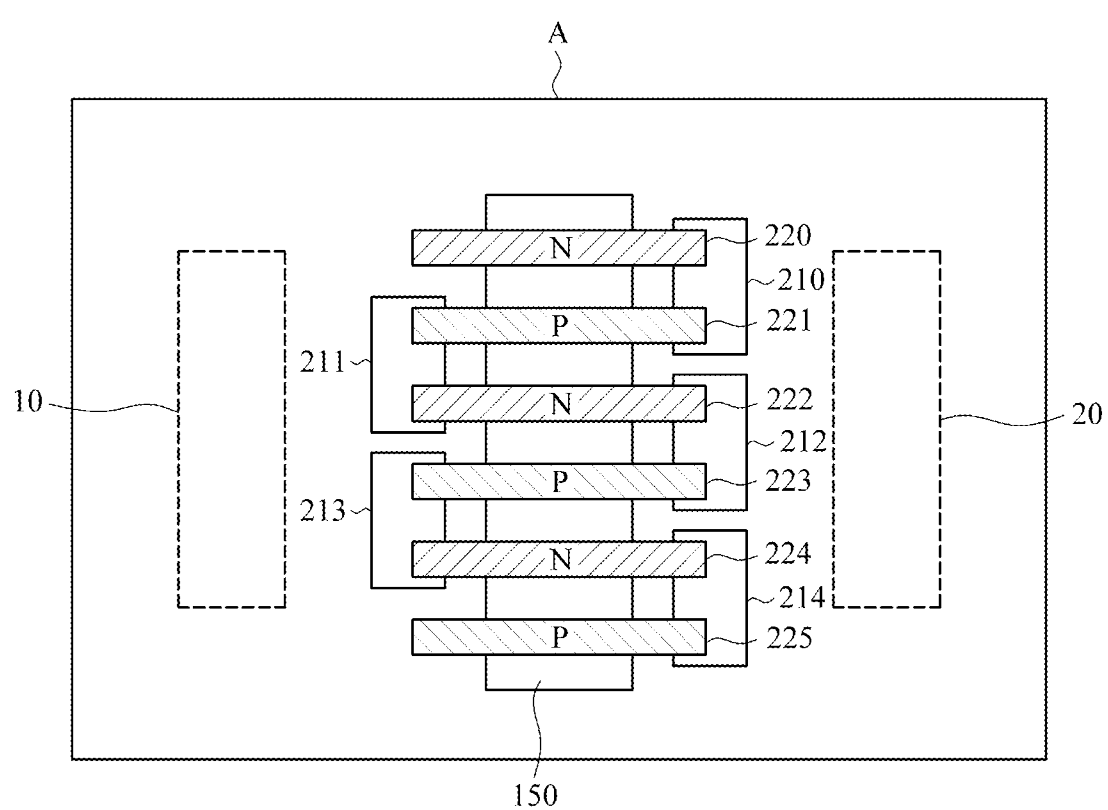
FIG. 2 illustrates an exemplary configuration of a middle substrate of the thermoelectric device shown in FIG. 1.

FIG. 2 illustrates an exemplary configuration of a middle substrate of the thermoelectric device shown in FIG. 1.

In detail, FIG. 2 illustrates a configuration of a region indicated as reference numeral 'A' of the thermoelectric device 100 shown of FIG. 1. N-type thermopiles 220, 222 and 224 are disposed alternately with P-type thermopiles 221, 223 and 225 on an upper surface of the middle substrate 110. A plurality of electrodes 210, 211, 212, 213 and 214 are connected to ends of the N-type thermopiles 220, 222 and 224 and the P-type thermopiles 221, 223 and 225 such that the N-type thermopiles 220, 222 and 224 and the P-type thermopiles 221, 223 and 225 are electrically connected in series. For convenience's sake, FIG. 2 shows electrodes that are used to electrically connect N-type thermopiles and P-type thermopiles, which are formed across a single cavity, in series. Although not shown, the configuration of electrodes shown in FIG. 2 is applied to other electrodes that are used to electrically connect in series N-type thermopiles and P-type thermopiles, which are formed across other cavities.

In FIG. 2, a region 10 represents a region to which the high temperature substrate 140 is bonded. A region 20 represents a region to which the low temperature substrate 130 is bonded.

Figure 3A:
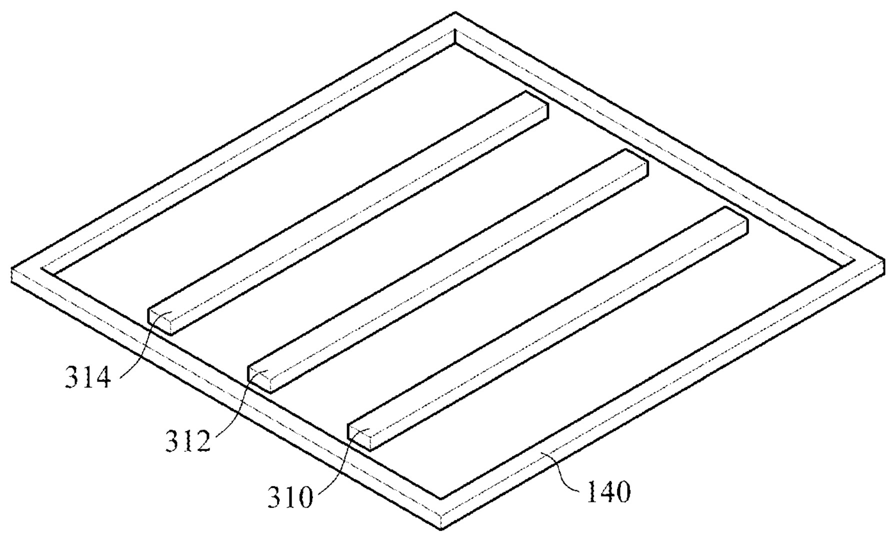
FIG. 3A illustrates a high temperature substrate included in the thermoelectric device shown in FIG. 1.
Figure 3B:
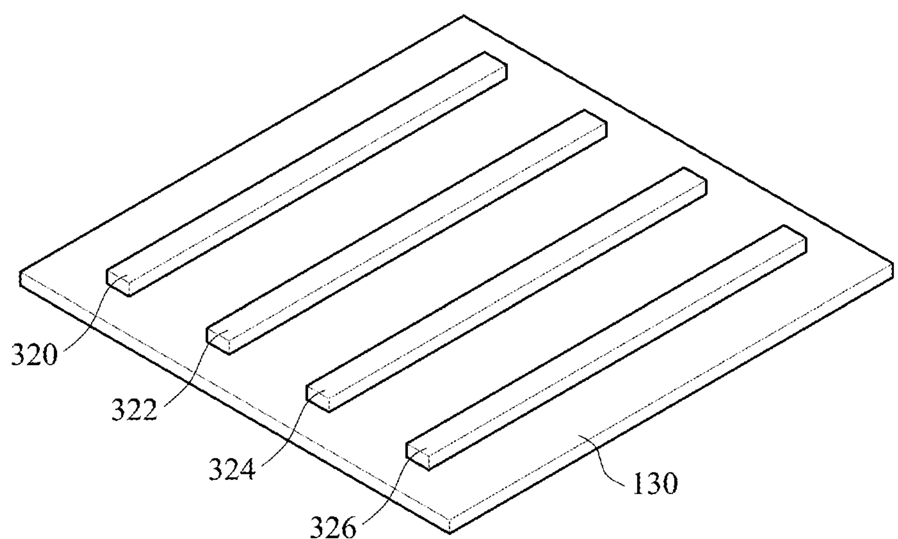
FIG. 3B illustrates a low temperature substrate included in the thermoelectric device shown in FIG. 1.
Figure 3C:
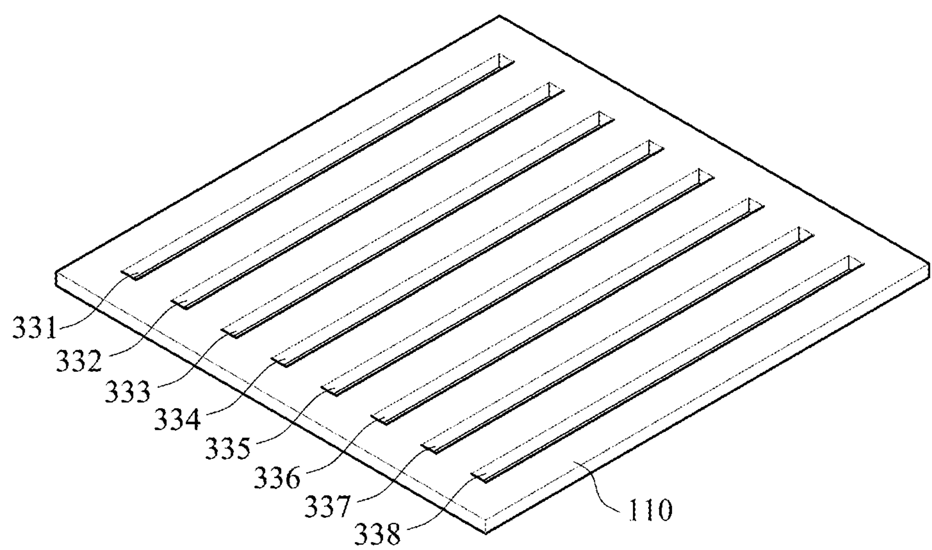
FIG. 3C illustrates a middle substrate included in the thermoelectric device shown in FIG. 1.

FIG. 3A illustrates the high temperature substrate 140 included in the thermoelectric device 100 shown in FIG. 1. FIG. 3B illustrates the low temperature substrate 130 included in the thermoelectric device 100 shown in FIG. 1. FIG. 3C illustrates the middle substrate 110 included in the thermoelectric device 100 shown in FIG. 1.

As shown in FIG. 3A, the high temperature substrate 140 includes a plurality of projection parts 310, 312 and 314. The plurality of projection parts 310, 312 and 314 correspond to bonding ends which are bonded to the middle substrate 110.

As shown in FIG. 3B, similar to the high temperature substrate 140, the low temperature substrate 130 includes a plurality of projection parts 320, 322 and 324 and 326. The plurality of projection parts 320, 322 and 324 and 326 formed on the low temperature substrate 130 do not overlap with the projection parts 310, 312 and 314 on the high temperature substrate 140, and correspond to bonding ends which are bonded to the middle substrate 110.

As shown in FIG. 3C, the middle substrate 110 includes a plurality of cavities 331, 332, 333, 334, 335, 336, 337 and 338 that are configured to allow a heat transferred from the high temperature substrate 140 to pass into the low temperature substrate 130 only through the thermopiles. The plurality of cavities 331, 332, 333, 334, 335, 336, 337 and 338 are formed through the middle substrate 110. As shown in FIG. 3C, each of the plurality of cavities 331, 332, 333, 334, 335, 336, 337 and 338 may have a bar shape.

The plurality of projection parts 310, 312 and 314 of the high temperature substrate 140 are disposed such that the projection parts 310, 312 and 314 are spaced apart from each other while each pair of adjacent projection parts straddles two cavities formed through the middle substrate 110. The plurality of projection parts 320, 322, 324 and 326 of the low temperature substrate 130 are disposed such that the projection parts 320, 322, 324 and 326 are spaced apart from each other while each pair of adjacent projection parts straddles two cavities formed through the middle substrate 110. The plurality of projection parts 310, 312 and 314 of the high temperature substrate 140 and the plurality of projection parts 320, 322, 324 and 326 of the low temperature substrate 130 are installed such that the plurality of projection parts 310, 312 and 314 of the high temperature substrate 140 do not overlap with the plurality of projection parts 320, 322, 324 and 326 of the low temperature substrate 130 when attached to the middle substrate 110.

As previously discussed, in many thin film thermoelectric devices, the electrical and thermal connections are achieved together. In such devices, only a small area of each thermopile is provided as a bonding area, and a thermoelectric device including a plurality of thermopiles has a plurality of bonding areas. Accordingly, in such devices, in order to prevent the thin film thermopiles which have a low mechanical strength from being broken, the bonding pressure needs to be finely adjusted in a bending process by which the upper wafer and the lower wafer are bonded to the thermopiles. If the bonding pressure is excessively great, the thermopiles may be broken and if the bonding pressure is excessively small, some of the thermopiles may not bonded and thus failures may result in the serial electrical connections.

According to certain embodiments described herein, the projection parts 310, 312 and 314 of the high temperature substrate 140 and the projection parts 320, 322, 324 and 326 of the low temperature substrate 130 are bonded to the middle substrate 110 and are bar-shaped. That is, due to the bonded surface areas of the projection parts, the thermoelectric device 100 according has a bonding area larger than that of other thermoelectric devices. In addition, the high temperature substrate 140 and the low temperature substrate 130 are not directly bonded to the thermopiles but rather to the middle substrate 110. Accordingly, even if a great level of bonding pressure is applied during bonding, the thermopiles are not broken. Therefore, the bonding may be achieved over a larger bonding area and with a greater bonding pressure, thereby increasing the yield rate and reducing the thermal resistance of the bonding area.

Figure 4:
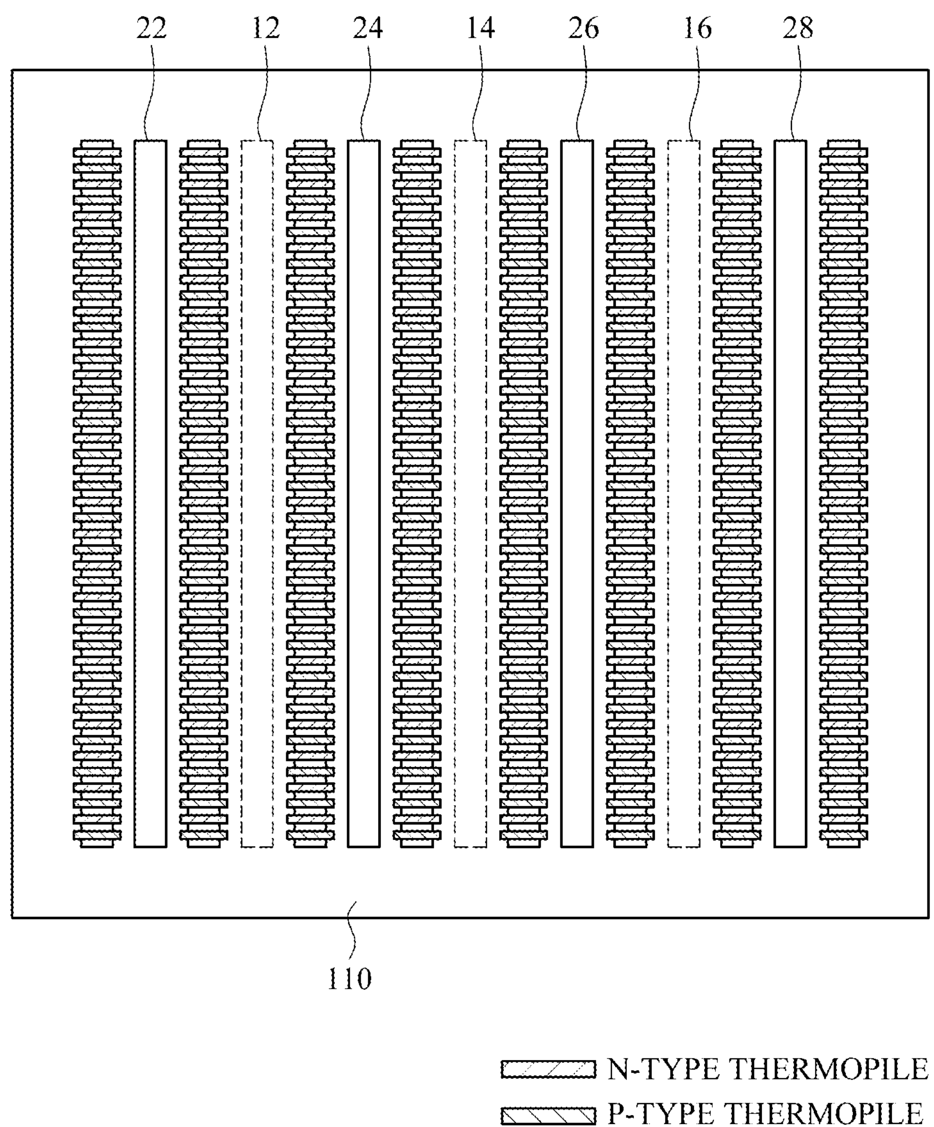
FIG. 4 illustrates a configuration of a middle substrate on which N-type thermopiles and P-type thermopiles are disposed.

FIG. 4 illustrates a configuration of a middle substrate on which N-type thermopiles and P-type thermopiles are disposed.

In detail, FIG. 4 illustrates the disposition of N-type thermopiles and P-type thermopiles on a middle substrate 100 having a plurality of cavities. Although not shown in FIG. 4, one or more electrodes may be attached on one surface of the middle substrate 110 such that the N-type thermopiles and the P-type thermopiles are electrically connected in series via the one or more electrodes.

Areas 12, 14 and 16 represent areas of the middle substrate 110 where the projection parts (310, 312 and 314 in FIG. 3A) of the high temperature substrate (140 in FIG. 3A) are bonded to the middle substrate 110. Areas 22, 24, 26 and 28 represent areas of the middle substrate 110 where the projection parts (320, 322, 324 and 326 in FIG. 3B) of the low temperature substrate (130 in FIG. 3B) are bonded to the middle substrate 110.

Figure 5A:
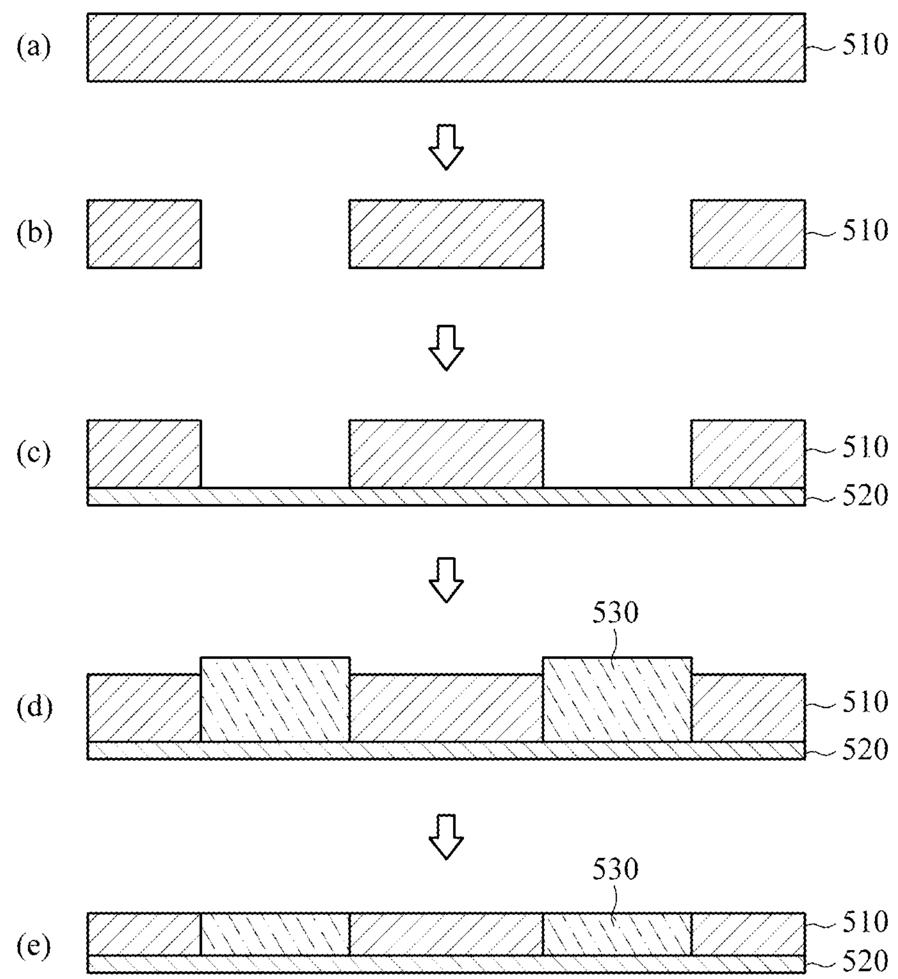
FIGS. 5A and 5B illustrate a process of manufacturing a thermoelectric device according to an embodiment.
Figure 5B:
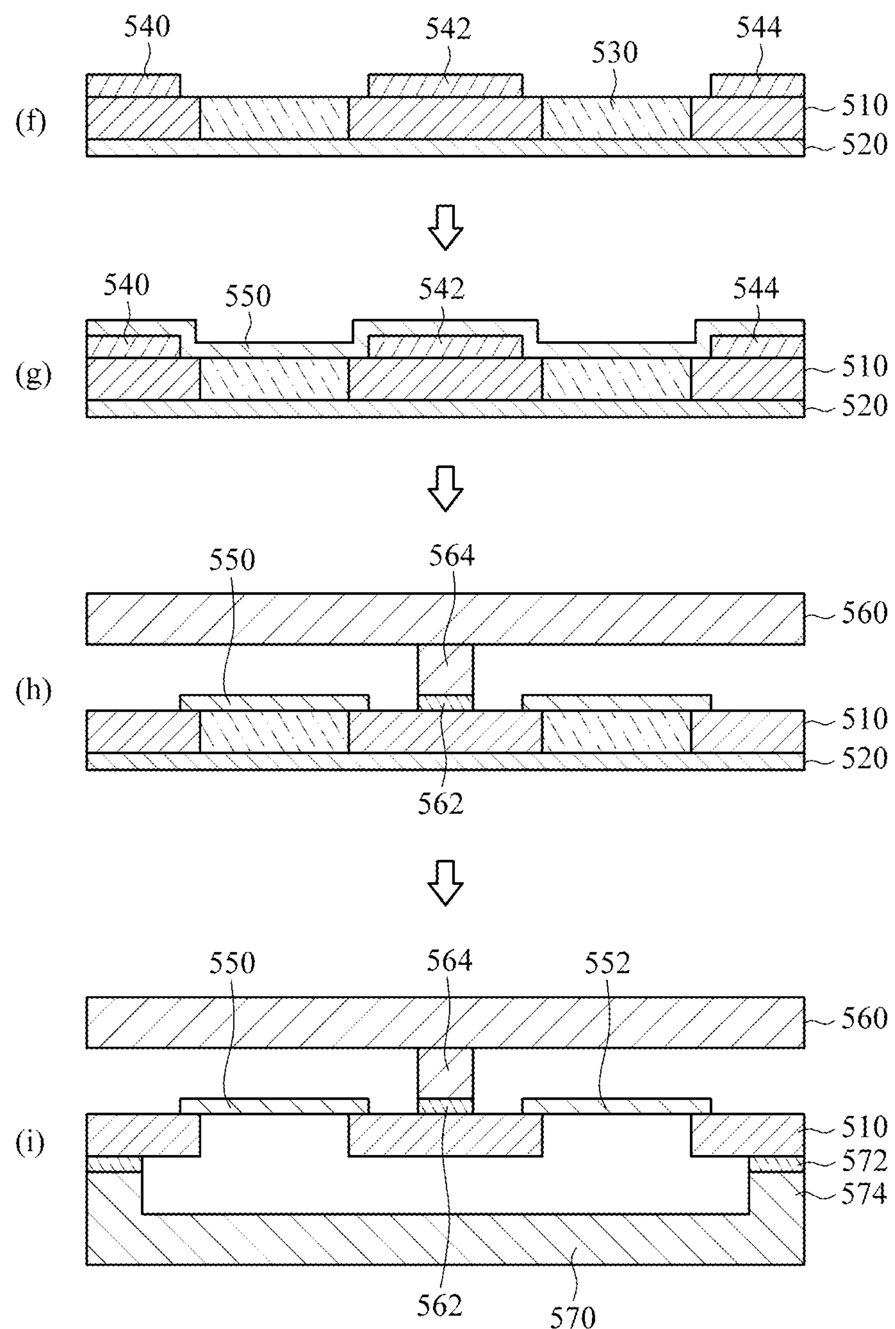

FIGS. 5A and 5B illustrate a process of manufacturing a thermoelectric device according to an embodiment.

As shown in FIG. 5A, a middle substrate 510 is provided in operation (a). The middle substrate 510 may be prepared using a glass wafer. A plurality of cavities are formed through the middle substrate 510 in operation (b). The plurality of cavities may be formed using one of various types of cavity forming schemes, such as wet etching, sand blasting, and a laser process.

In order to fill in the cavities of the middle substrate 510 with a material that is to be removed later, in operation (c), a thin film 520 is laminated to a lower surface of the middle substrate 510 such that a dam is formed blocking the lower ends of the cavities in the middle substrate 510. To this end, a dry photoresist film 520 is laminated to the lower surface of the middle substrate 510. Thereafter, in operation (d), a dispensing material 530, such as Polyimide (PI) or Benzocyclobutene (BCB), is dispensed in at least one of the cavities.

Thereafter, the middle substrate 510 is subject to a planarization through a Chemical Mechanical Polishing (CMP) in operation (e). Thereafter, electrodes are formed on the middle substrate having been subject to the planarization such that a plurality of thermopiles including N-type thermopiles and P-type thermopiles are electrically connected in series by the electrodes. Descriptions of the forming of the electrodes will be omitted to enhance clarity and conciseness.

As shown in FIG. 5B, mask patterns 540, 542 and 544 are formed on the at least one electrode (not shown) in operation (f) such that the N-type thermopiles and the P-type thermopiles are formed through a lift off patterning. The mask patterns 540, 542 and 544 are formed through a photoresist (PR) coating. Then, the thermopiles 550 are deposited through a sputtering in operation (g). The thermopiles 550 are formed by thin film processing such as deposition or plating. The thermopiles 550 are formed to be parallel to the middle substrate 510. Alternatively, the thermopiles 550 may be slantingly formed with respect to the middle substrate 510 depending on the shape of the surface on which the thermopiles 550 are formed.

After performing operations (f) and (g) to form the N-type thermopiles, a sequence including operations (f) and (g) is repeated to form the P-type thermopiles. The thermopiles may be formed using Bismuth Telluride (BiTe), but the material of the thermopiles is not limited thereto. As described above, if the thermopiles 550 are formed on the electrode through a deposition process such as a sputtering, an electrical contact resistance between the at least one electrode and the thermopiles is substantially reduced as compared to a formation and bonding processing using a soldering material. In addition, the thermopiles 550 are formed after the at least one electrode has been formed, thereby achieving electrical connections having a substantially low electrical contact resistance.

When the mask patterns 540, 542 and 544 are removed, the middle substrate 510 remains with the thermopiles disposed thereon as shown in operation (h). Thereafter, the low temperature substrate 560 is attached to the middle substrate 510 in operation (h). When the low temperature substrate 560 is attached to the middle substrate 510, an adhesion material, such as a solder 562, having a superior heat transfer characteristic may be used. Bonding is achieved by attaching a projection shaped bonding end 564 of the low temperature substrate 560 to the middle substrate 510, so the low temperature substrate 560 is spaced apart from the middle substrate 510.

The dispensing material 530, such as BCB or PI, and the thin film 520, such as a dry PR film, may be removed through an oxygen plasma process, and cavities are formed under the thermopiles 550. Thereafter, the middle substrate 510 is attached to the high temperature substrate 570 in operation (i). When the high temperature substrate 570 is attached to the middle substrate 510, an adhesion material such as a solder 572, having a superior heat transfer characteristic may be used. Bonding is achieved by attaching a projection shaped bonding end 574 of the high temperature substrate 570 to the middle substrate 510, so the high temperature substrate 570 is spaced apart from the middle substrate 510. In order to prevent heat from transferring from the high temperature substrate 570 to the middle substrate 510 through convection, radiation and so on, a height of the projection or a thickness of the solder 572 may be increased. Alternatively, in order to space the high temperature substrate 570 and the low temperature substrate 560 away from the middle substrate 510, an adhesion material having a large thickness may be used instead of the use of projections on the high temperature substrate 570 and the low temperature substrate 560.

As described above, the thermopiles are manufactured using a thin film process, so that the thermal resistance of the thermopiles is increased. In addition, thermal connections are implemented by bonding the low temperature substrate and the high temperature substrate to the middle substrate rather than to the thermopiles directly. In this way, the thermal connection is implemented through a large surface area, and thus the thermal contact resistance is substantially lowered. In addition, thermopiles of a thin film type are provided on a middle substrate, thereby providing the thermoelectric device with a high mechanical strength.

Figure 6:
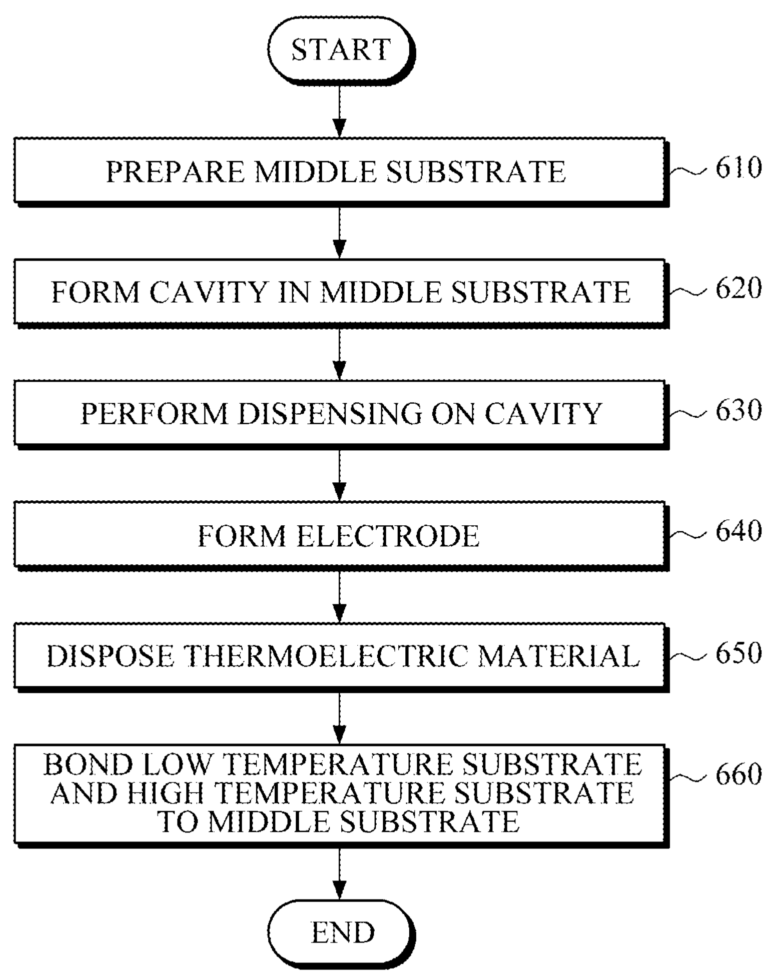
FIG. 6 is a flowchart showing a method of manufacturing a thermoelectric device according to an embodiment.

FIG. 6 is a flowchart showing a method of manufacturing a thermoelectric device according to an embodiment.

A middle substrate is prepared (610). At least one cavity is formed through the middle substrate (620). A dispensing material is dispensed in the at least one cavity (630). Electrodes are formed on the middle substrate having been subject to the dispensing such that N-type thermopiles and P-type thermopiles are electrically connected in series by the electrodes (640).

The N-type thermopiles and the P-type thermopiles are disposed on the middle substrate by use of mask patterns (650). The N-type thermopiles and the P-type thermopiles may be disposed in parallel to the middle substrate using a deposition process.

The dispensing material is removed, and a low temperature substrate and a high temperature substrate are bonded to an upper part and a lower part of the middle substrate, respectively, such that a temperature difference is provided to opposite sides of each of the N-type thermopiles and the P-type thermopiles (660). The thermoelectric device manufacturing method according to this embodiment is illustrative only, and it would be appreciated that changes and modifications may be made.

Although exemplary embodiments have been described for illustrative purposes, those skilled in the art will appreciate that various modifications, additions and substitutions are possible, without departing from the scope and spirit of the inventive concept of the accompanying claims.

What is claimed is:

1. A thermoelectric device comprising:

a middle substrate comprising a single layer;

a plurality of N-type thermopiles and P-type thermopiles disposed on a first surface of the single layer of the middle substrate, wherein the N-type thermopiles and the P-type thermopiles are alternately arranged and are electrically connected to each other in series;

a first substrate that is thermally bonded to the first surface of the single layer of the middle substrate, such that the first substrate is directly thermally bonded to a region of the single layer of the middle substrate at a first side of each of the plurality of N-type thermopiles and to a region of the single layer of the middle substrate at a first side of each of the plurality of P-type thermopiles, and wherein the first substrate is not in physical contact with any of the plurality of N-type thermopiles and is not in physical contact with any of the plurality of P-type thermopiles and a second substrate that is thermally bonded to a second surface of the single layer of the middle substrate, such that the second substrate is directly thermally bonded to a region of the single layer of the middle substrate at a second side, opposite the first side, of each of the N-type thermopiles and to a region of the single layer of the middle substrate at a second side, opposite the first side, of each of the P-type thermopiles, and wherein the second substrate is not in physical contact with any of the plurality of N-type thermopiles and is not in physical contact with any of the plurality of P-type thermopiles.

2. The thermoelectric device of claim 1, further comprising at least one electrode disposed on the middle substrate and connected to the N-type thermopiles and the P-type thermopiles, wherein the N-type thermopiles and the P-type thermopiles are connected to each other in series via the at least one electrode.

3. The thermoelectric device of claim 1, wherein the N-type thermopiles and the P-type thermopiles are formed of a thin film.

4. The thermoelectric device of claim 1, wherein one of the first substrate and the second substrate is a low temperature substrate and the other of the first substrate and the second substrate is a high temperature substrate provided at a temperature higher than a temperature of the low temperature substrate.

5. The thermoelectric device of claim 4, wherein the middle substrate has at least one cavity that is configured such that heat from the high temperature substrate is transmitted to the low temperature substrate only through the N-type thermopiles and the P-type thermopiles.

6. The thermoelectric device of claim 5, wherein the at least one cavity comprises a plurality of cavities each having a bar shape.

7. The thermoelectric device of claim 6, wherein each of the first substrate and the second substrate comprises a plurality of bonding protrusions by which it is bonded to and spaced apart from the single layer of the middle substrate, wherein, for each of the first substrate and the second substrate, each two adjacent bonding protrusions straddle two of the plurality of cavities of the single layer of the middle substrate.

8. The thermoelectric device of claim 7, wherein each of the bonding protrusions of the first substrate and the second substrate has a bar shape.

9. A thermoelectric device comprising:

a middle substrate comprising a single layer;

a plurality of N-type thermopiles and P-type thermopiles disposed on a first surface of the single layer of the middle substrate, wherein the N-type thermopiles and the P-type thermopiles are alternately arranged and are electrically connected to each other in series;

a first substrate that is thermally bonded to the first surface of the single layer of the middle substrate, such that the first substrate is directly thermally bonded to a region of the single layer of the middle substrate at a first side of each of the plurality of N-type thermopiles and to a region of the single layer of the middle substrate at a first side of each of the plurality of P-type thermopiles; and a second substrate that is thermally bonded to a second surface of the single layer of the middle substrate, such that the second substrate is directly thermally bonded to a region of the single layer of the middle substrate at a second side, opposite the first side, of each of the N-type thermopiles and to a region of the single layer of the middle substrate at a second side, opposite the first side, of each of the P-type thermopiles;

wherein the single layer of the middle substrate comprises a material having a heat transfer coefficient smaller than a heat transfer coefficient of a material which bonds the first substrate and the second substrate to the single layer of the middle substrate.

10. The thermoelectric device of claim 2, wherein the at least one electrode, the N-type thermopiles, and the P-type thermopiles are formed on the first surface of the single layer of the middle substrate.

11. A thermoelectric device comprising:

a middle substrate comprising a single layer having a plurality of cavities formed therein;

a plurality of thermopiles alternately arranged on a first surface of the single layer of an the middle substrate, wherein each one of the plurality of thermopiles spans one of the plurality of cavities, wherein the plurality of thermopiles are electrically connected in series;

a first substrate thermally bonded to the first surface of the single layer of the middle substrate by a plurality of first bonding elements, wherein the first substrate is not in physical contact with any of the plurality of thermopiles;

a second substrate thermally bonded to a second surface of the single layer of the middle substrate by a plurality of second bonding elements, wherein the second substrate is not in physical contact with any of the plurality of thermopiles;

wherein the first bonding elements and the second bonding elements are bonded to the single layer of the middle substrate such that heat transfer between the first substrate and the second substrate passes through the plurality of thermopiles via the first and second bonding elements.

* * * * *